United States Patent [19]

Pelletier

[11] 4,030,052

[45] June 14, 1977

[54] FLAT TUNER

[75] Inventor: Fernand Flavien Pelletier, Elmhurst, Ill.

[73] Assignee: Motorola, Inc., Schaumburg, Ill.

[22] Filed: Sept. 22, 1975

[21] Appl. No.: 615,617

[52] U.S. Cl. .................................. 334/7; 74/10.33; 74/10.8
[51] Int. Cl.² ........................................ H03J 5/12
[58] Field of Search ............ 334/7; 74/10.1, 10.33, 74/10.37, 10.45, 10.8, 10.9

[56] References Cited

UNITED STATES PATENTS

| | | | |
|---|---|---|---|
| 3,247,728 | 4/1966 | Wolf et al. | 334/7 X |
| 3,431,787 | 3/1969 | Frank et al. | 334/7 X |
| 3,602,051 | 8/1971 | Olah | 334/7 |
| 3,832,907 | 9/1974 | Yasuda | 334/7 X |
| 3,906,806 | 9/1975 | Harlan | 334/7 X |
| 3,946,344 | 3/1976 | Wilkinson | 334/7 |

*Primary Examiner*—Paul L. Gensler
*Attorney, Agent, or Firm*—James W. Gillman; Donald J. Lisa

[57] ABSTRACT

A treadlebarless pushbutton tuner has a slug tuned coil housing assembly, a plurality of pushbutton assemblies each carrying a presettable memory cam means to recall a memorized broadcast frequency and a slide bar mounted horizontally in a tuner frame and slideable sideways for positioning the slugs within the coil housing corresponding to the memorized frequency of the cam carried by an actuated pushbutton. The slide bar has a plurality of V shaped notches aligned with the pushbutton assemblies, movement of a memory cam in the V groove causing the sideways movement of the slide bar which is translated to slug movement. Additional features include a horizontal crown gear in the manual tuning control means, means for declutching a clutch mechanism when recalling a memorized frequency and improved means for disabling the declutch mechanism when setting up a new frequency on any one of the pushbuttons. Also provided is a simplified means for locking and unlocking the memory cams. The height of the radio when assembled presents a very low profile with an overall thickness in the range of 0.62 inches.

12 Claims, 14 Drawing Figures

FLAT TUNER

BACKGROUND OF THE INVENTION

1. Field of the Invention

Generally, the invention relates to a pushbutton tuner. In particular, the invention relates to such tuners that do not have a conventional treadle bar and in which the overall height of the tuner is minimized by placing key components such as the pushbutton assemblies, carriage drive means and crown gear horizontally in the tuner frame for horizontal movement therein.

2. Prior Art

Conventional pushbutton tuners have treadle bars which are used to translate pushbutton actuation or operation of the manual tuning control into movement of the core carriage for positioning the cores within a coil housing for tuning the radio. The method by which such conventional tuners operate normally includes the following steps: manually tuning the radio to position the treadle bar and core carriage at a location representative of a predetermined frequency, pulling out one of the pushbuttons to thereby free a memory cam, pushing in the pushbutton and the memory cam to position the memory cam against the treadle bar, further pushing in the pushbutton without moving the treadle bar or cam to lock the cam and then releasing the pushbutton. Having thereby set the predetermined frequency on the memory cam, that frequency can always be recalled by simply pushing in the pushbutton to reposition the treadle bar and core carriage.

The problem is that rotatably mounted treadle bars require too much vertical height for effective operation and have thereby been a limiting factor in reducing the overall vertical height of the tuner. The same is true of the crown gear which is a wide gear, due to the gear reduction required, and is normally vertically disposed in the tuner for rotation about a horizontal axis.

Thick tuners have become objectionable to radio manufacturers, particularly automobile radio manufactures. For example, the excessive materials required in construction have run the cost up too high; the available space for a radio in an automobile dashboard has been continuously reduced; the introduction of FM with AM components in the radio and the combining of the radio with tape decks has increased the overall thickness of the entertainment center package.

Further, innovations in semiconductor technology have made possible the fully electronic tuning of a radio in a relatively compact package. However, car radio manufacturers still require slug tuned sets in their line of radios and there is a need for such a compact slug tuned set which can occupy the same physical space of a fully electronic set or is adaptable for use with a hybrid radio which is both slug tuned, for AM for example, and electronically tuned, for FM for example.

A flat treadlebarless pushbutton AM/FM tuner has been proposed. One such system is shown in Olah, U.S. Pat. No. 3,727,156, assigned to the same assignee as is the present invention, using horizontal slides in the pushbutton assemblies to activate the core carriage through a complex rack and gear arrangement for positioning the cores in the core housing. The proposed radio also shows declutch and declutch disabling means. While the overall height of the proposed tuner is minimized, measuring ¾ of an inch to 1 inch in overall vertical height, it is not thin enough. The present need is for a radio-tape player combination, for example, that is no more than 26 mm. high. Thus, thinness and simplicity continue to be a nagging problem for tuner manufacturers.

Applicant has overcome the problem in the present invention through the use of a horizontal slide bar to drive the tuning means and by orienting all key components, such as the pushbutton slide mechanisms and the crown gear horizontally. While a similar horizontal slide with V shaped grooves has been known previously, one such slide being shown in Wolf, U.S. Pat. No. 3,247,728, assigned to the same assignee as is the present invention, there the slide is used in a conventional AM/FM tuner with a treadlebar to selectively actuate an AM/FM selector switch between one of two positions.

Through applicant's substitution of a unique horizontal slide bar mechanism for the conventional treadlebar, and by placing the crown gear horizontally, applicant has been able to also obtain significant simplification and improvements in the presettable memory cam apparatus, declutching apparatus and declutching disable apparatus.

SUMMARY OF THE INVENTION

Accordingly, it is an object of the present invention to provide a flat treadlebarless tuner with significantly reduced overall thickness and simplicity of operation accomplished through the use of a horizontally placed slide bar for driving the tuning means, and a manual tuning control means coupled to the slide bar through a horizontally placed crown gear with improved declutch apparatus.

It is a further object of the present invention to provide an improved presettable memory cam apparatus using a much simplified declutch disabling means operable when setting up a frequency on the memory cam.

It is another object of the present invention to provide a pushbutton tuning assembly especially adapted for use with slug tuned radios or hybrid radios which are partially slug tuned and partially electronically tuned.

Briefly, the invention comprises a tuner frame, tuning means mounted to the frame movable through a range of positions representative of desired broadcast frequencies, a plurality of pushbutton assemblies mounted in the frame for in and out movement and each one of which carries a presettable memory cam means for recalling a memorized broadcast frequency when one of the pushbutton assemblies is pushed inwardly, and slide bar means having a relatively thin vertical dimension mounted horizontally in the frame and slideable sideways for positioning the tuning means in response to the driving actuation by any one of the memory cams to thereby drive the tuning means to the position corresponding to the memorized frequency of the cam carried by the actuated pushbutton.

Further objects and features of the invention will be understood from the Detailed Description Of The Drawings and the Preferred Embodiments which follow.

DETAILED DESCRIPTION OF THE DRAWINGS

DESCRIPTION OF THE PREFERRED EMBODIMENTS

Figure 1:
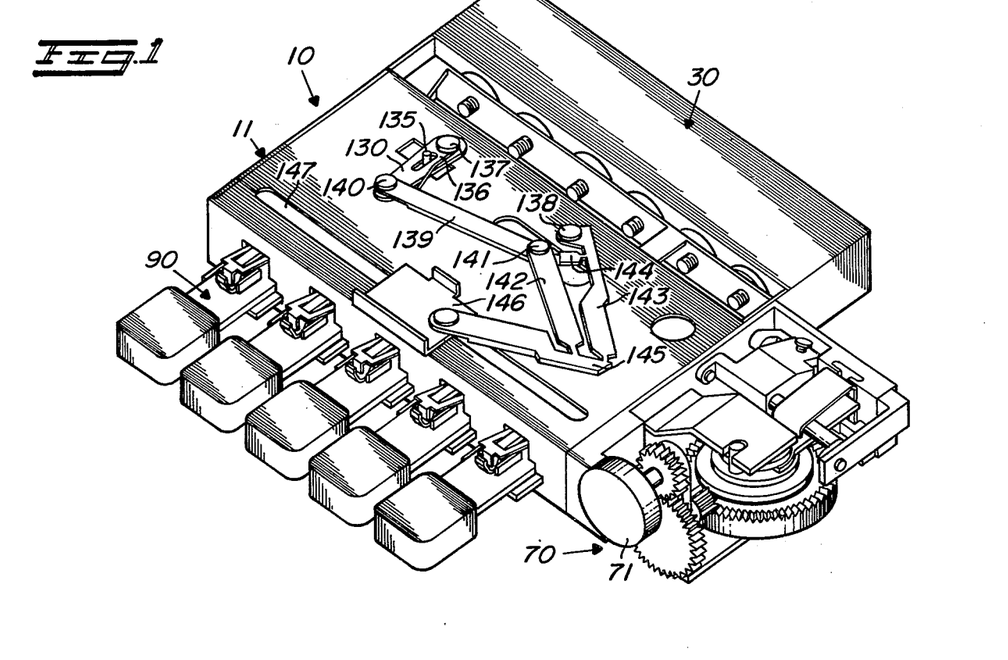
FIG. 1 is a perspective view in partial section of the flat pushbutton tuner of the present invention.

Referring now to the drawings in which the same number is used in each drawing to refer to the same or similar parts, FIG. 1 shows a flat tuner 10 of the present invention comprising a tuner frame 11, tuning means 30 mounted to the frame, a plurality of pushbutton assemblies 90, manual tuning control means 70 and pointer assembly 130. The tuner is adapted for indash mounting in an automobile (not shown) and may be used as an AM tuner or an FM tuner or a combination AM/FM tuner by simply throwing a switch (not shown) which electrically couples the tuning means to an appropriate tuning circuit as is known in the art.

Figure 3:
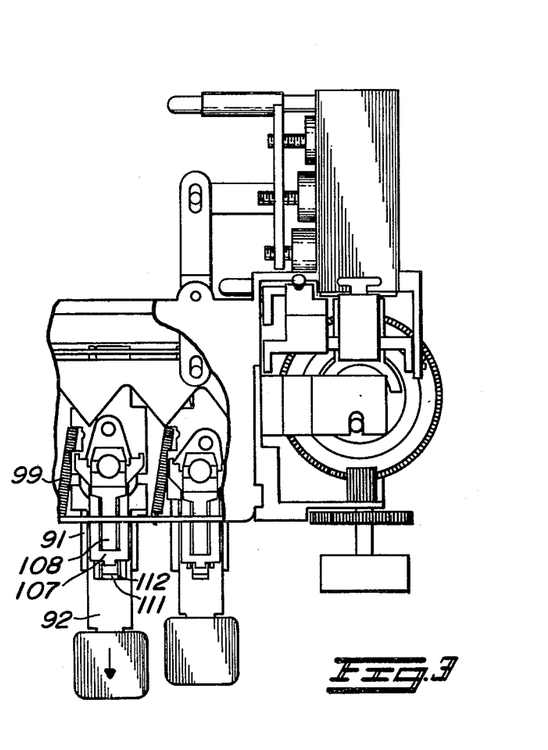
FIG. 3 is a plan view in partial section of the pushbutton presettable memory cam with the left pushbutton in the unlocked extended position and the right pushbutton in the normal locked position. The coil housing is shown located toward the right side of the tuner for movement transverse the path of movement of the pushbutton assemblies.
Figure 4:
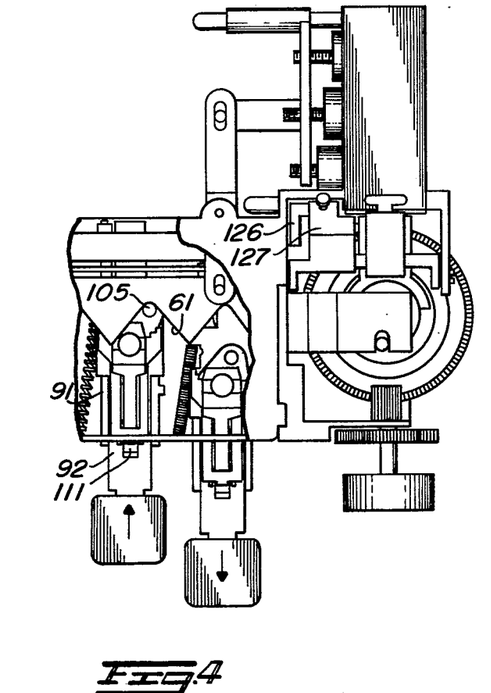
FIG. 4 is a view similar to FIG. 3 showing the left pushbutton in the inward position with the cam bottomed out in its assigned V groove for recalling a previously memorized frequency.
Figure 5:
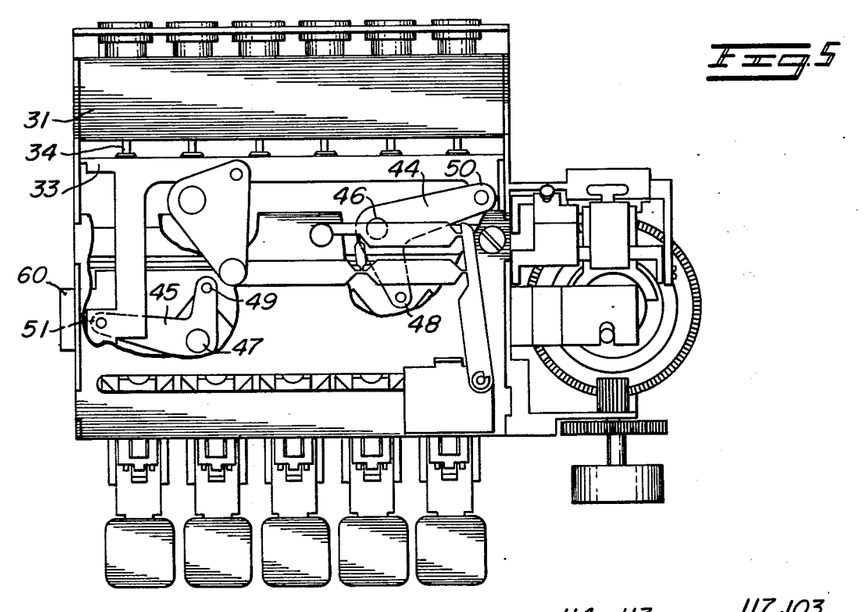
FIG. 5 is a plan view of the tuner of FIG. 1 with portions broken away to show the bell crank linkages for positioning the core carriage when the coil housing is located to the rear of the tuner in line with the path of movement of the pushbutton assemblies.

The tuner frame comprises a sheet metal member 12 (FIG. 2) forming a top wall having a depending flange forming a front wall 13 having a plurality of slots 14 one for guiding each pushbutton assembly. Side wall 15 is a sheet metal member mounted by screw 16. The other side wall 17 provides supporting structure for the manual tuning control means 70, described hereinafter and is mounted to the top wall by screws 18a and 18b. Rear wall 19 is mounted to the side walls by screws 20 and 18b. Tuning means 30 may either be mounted to the rear of the tuner frame as shown in FIGS. 1 and 5 or toward the side of the tuner frame in a different embodiment as shown in FIGS. 2, 3 and 4.

Figure 2:
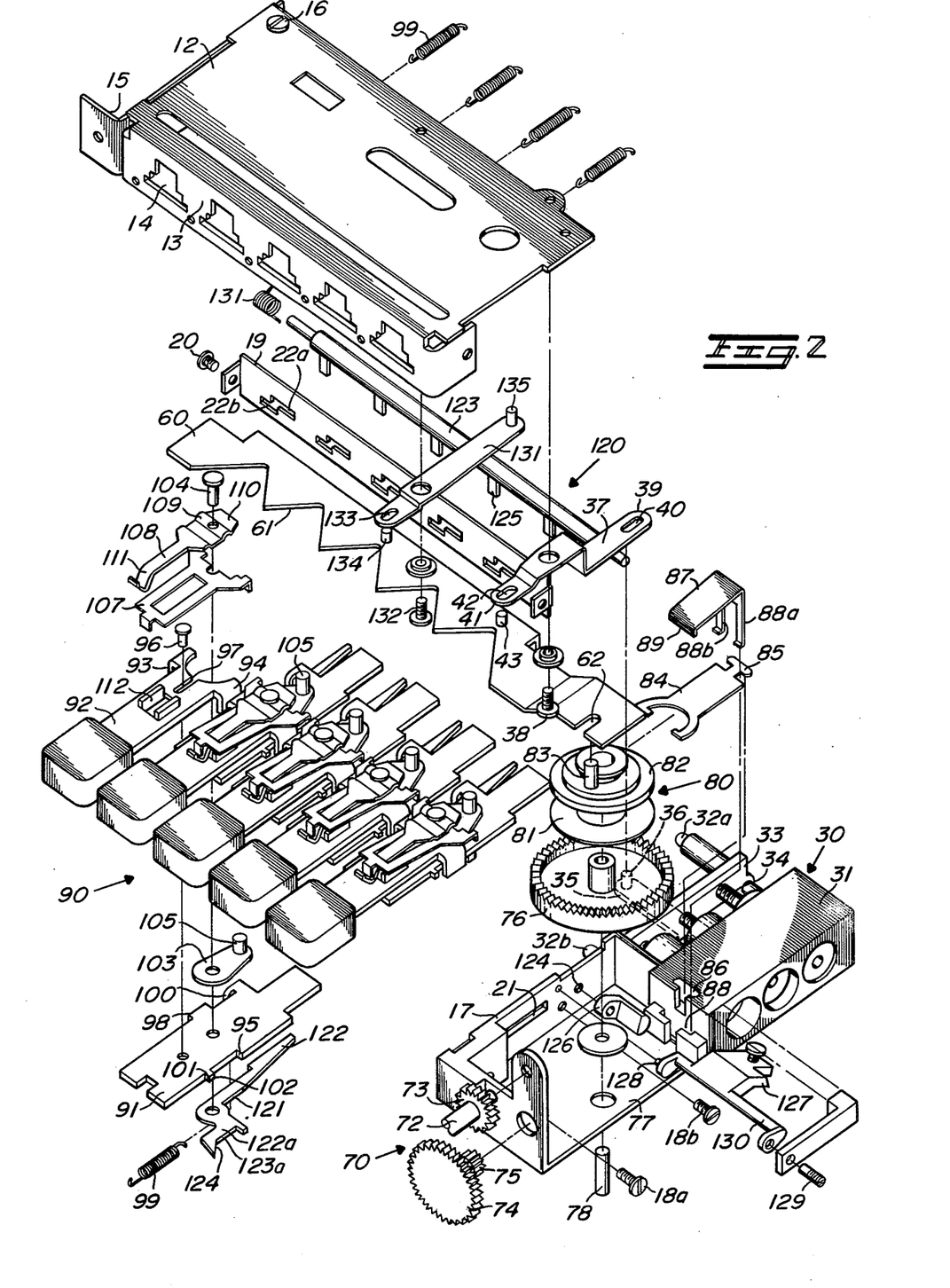
FIG. 2 is an exploded perspective of one embodiment of the tuner of the present invention.

As shown in FIG. 2 the tuning means 30 comprises a coil housing 31 having a plurality of coils mounted therein (not shown), a pair of guide pins 32a, 32b, a core carriage 33 slideably mounted on guide pins 32a, 32b carrying a plurality of cores 34 positionable within the coils of the coil housing for tuning a selected broadcast frequency in response to either pushbutton or manual tuning operation as described hereinafter. Carriage 33 has an arm 35 shown in dotted lines in FIG. 2 carrying a pin 36. Lever arm 37 is pivotably connected by screw 38 to the underside of top wall 12 and has one end 39 having a slot 40 receiving pin 36 of the core carriage. The other end 41 of lever arm 37 has a slot 42 receiving pin 43 of a slide bar 60. Lever arm 37 thus connects the slide bar means and the core carriage for converting sideways movement of the slide bar to in and out movement of the cores for tuning the receiver. In FIG. 2 the cores 34 are movable in planes transverse to the paths of movement of the pushbuttons. In the embodiment of FIG. 1 and 5 the cores are movable in planes parallel to the paths of movement of the pushbuttons. In the FIG. 5 embodiment bell cranks 44, 45 are pivotably mounted to the underside of the top wall 12 by pins 46, 47, respectively, with one end of the bell crank 48, 49 pivotably connected to pins on the slide bar 60 and the other ends 50, 51, respectively, connected to the core carriage 33 such that again sideways movement of the slide bar 60, as hereinafter described, is converted to in and out movement of the cores 34 within the coil housing 31 for tuning the radio.

The means for driving core carriage in response to either pushbutton or manual tuning operation is the slide bar 60 which is slideably mounted in slot 21 of side wall 17 and a corresponding slot (not shown) in the other side wall 15. The slide bar has a relatively thin vertical dimension and is horizontally positioned in the frame for sideways sliding movement to position the core carriage. Slide bar 60 has a plurality of shaped notches, each defining a V shaped cammed groove 61. Each notch 61 in the slide bar is aligned with a pushbutton assembly and is adapted for receiving the pin 105 of the memory cams mounted on the pushbutton, as described hereinafter. Inward movement of a memory cam 103, as hereinafter described, within its aligned notch 61 drives the slide bar sideways until the cam pin 105 is bottomed out in its assigned notch 61, the slide bar and tuning means being thereby moved to the position corresponding to the memorized frequency of the actuated cam 103.

For manual tuning of the radio there is provided a manual tuning control means 70 which includes a knob 71 (FIG. 1) accessible by the operator from the front panel of the dashboard connected by shaft 72 rotatably mounted in the front wall 13 of the tuner frame. Shaft 72 carries gear 73 which drives gear 74 also rotatably mounted to the front frame of the tuner and carrying pinion gear 75. Horizontal crown gear 76 is rotatably mounted to a bottom wall 77 of the tuner frame about shaft 78 and is driven by pinion gear 75.

Clutch means 80 couples rotation of the crown gear to slide bar 60. Clutch means 80 comprises an annular frictional member, such as a rubber washer 81, concentrically mounted over crown gear 76 and a clutch plate 82 rotatably mounted about shaft 78 and carrying eccentrically mounted pin 83 engagable in slot 62 of slide bar 60. A clutch plate arm 84 has one end connected to clutch plate 82 and the other end formed with a tab 85 which slides in a slot 86 in the core housing 31. Clutch plate hold down spring 87 is an L shaped spring having a pair of depending feet 88a, with turned in flanges at one end which snap into a slot 88 of the frame fixedly connecting spring 87 to a frame portion of coil housing 31. The other end of spring 87 having a turned in flange 89 is resiliently biased against the top of clutch plate arm 84 compressing clutch plate 82 and friction member 81 into frictional holding contact with crown gear 76 such that movement of the manual control knob 71 rotates the crown gear and the clutch plate and eccentric pin 83 to drive slide 60 sideways in response thereto for moving the core carriage to tune the radio.

As shown in FIGS. 1 and 2, a plurality of pushbutton assemblies 90 are used for memorizing are determined frequencies which can be recalled as desired by actuating one of the pushbuttons. All of the pushbutton assemblies are identical and only one will be described in detail. Each assembly includes a first horizontal slide 91 slideably mounted for in and out movement in guide slot 14 in the front wall of the frame and slot 22a in the rear wall 19 of the frame. Each slot 22a has an additional slot portion 22b for receiving finger 122 of declutch actuator 121 as described hereinafter. Slide extension 92, having U shaped depending flanges 93, 94, is mounted on top of slide 91 with depending flange 94 engaged in a notch 95 on the right side of slide 91. Rivet 96 through a longitudinal slot 97 of the slide extension 92 connects the slide extension 92 to slide 91 and permits limited in and out movement of slide extension 92 relative to slide 91. Outward movement of the extension 92 is limited by tab 94 striking the tab 102 at the outboard end of notch 95, and inward movement of slide extension 92 is limited by flanges 93 and 94 striking the inboard edge of tab 98 and the inboard wall of slot 95 respectively. Spring 99 (FIG. 3) has one end mounted to the front wall of the tuner and the other end mounted to a tab 100 (FIG. 2) to bias the pushbutton assembly outwardly so that the outboard edge 101 of tab 102 strikes against the inside of the front wall 13 of the tuner to limit outward movement of slide 91.

Slide 91 also carries memory cam 103 pivotably mounted about rivet 104 and having a protruding pin 105 for engaging the V notches 61 of the slide bar as described hereinafter. Spring 107 is mounted on top of slide 92 with one end bearing against the shaft of rivet 104 and the other end bearing against the top surface of lever arm 108. Lever arm 108 is fixed to slide 91 by rivet 104 having the middle portion 109 shaped to permit arm 108 to be fulcrummed such that the rear arm portion 110 thereof bears against the top of memory cam 103 and the forward end 111 can be biased into a slot 112 formed in slide extension 92 by the spring 107.

Operation of the pushbutton assembly to memorize a frequency is as follows. The manual tuning knob 71 is rotated to select the predetermined frequency thereby positioning the core carriage and slide 60 in a predetermined location. Slide extension 92 is pulled outward relative to slide 91 causing tab 94 to slide in notch 95 until it is halted by the inboard edge of tab 102. Simultaneously spring 107 pivots end 111 of lever arm 108 downwardly into the now aligned slot 112 of slide 92 which relieves the pressure of end 110 from cam 103 permitting the cam to be free to pivot about rivet 104. (See the left pushbutton assembly of FIG. 3). Next, the slide extension 92 is pushed inwardly (see the left pushbutton assembly of FIG. 4) which causes both the slide extension 92 and slide 91 to move inwardly because end 111 is engaged in the slot 112 of slide 92. (Shown clearly in FIG. 7). This inward movement causes pin 105 of the memory cam to engage the sides of the V slot of its aligned slide bar causing the memory cam to pivot until it is journaled at the bottom of the V groove 61 as shown in FIG. 4 where it is stopped. Further inward movement of slide extension 92 moves end 111 of the lever arm up onto the top surface of slide 92 (shown clearly in FIG. 6) causing end 110 of the lever arm to apply downward pressure on the top of cam 103 to lock the cam in the desired position. Release of the pushbutton returns slides 91 and 92 to the outboard position due to the action of bias spring 99. (See right slide in FIGS. 3, 4). The predetermined frequency is now memorized and may be recalled at any time regardless of the position of slide 61 by simply pushing in the pushbutton which causes pin 105 of cam 103 to engage the sides of slot 61 and reposition slide 60 to the position corresponding to the memorized frequency of the actuated cam.

Figures 6, 7A:
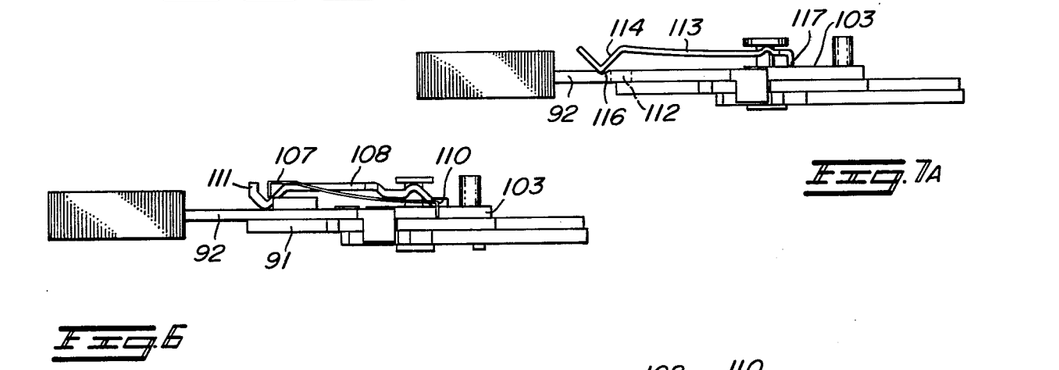
FIG. 6 is a side elevation view of one of the pushbutton assemblies of FIG. 2 with the memory cam locked.
FIG. 7A is a view similar to FIG. 7 showing an alternative embodiment of the presettable memory cam locking means.
Figure 7:
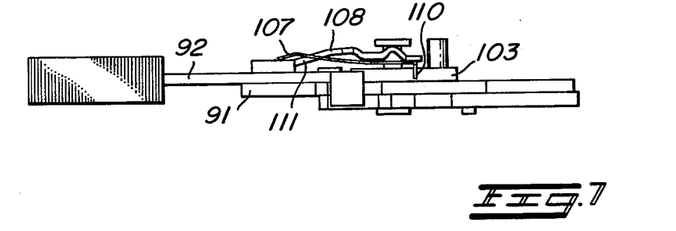
FIG. 7 is a view similar to FIG. 6 with the cam unlocked.

FIGS. 6 and 7 are side views of the pushbutton assembly described above showing the lever arm locking the cam (FIG. 6) and the slide extension 92 withdrawn such that the lever arm is unlocking the cam (FIG. 7).

FIG. 7A is an alternative construction in which the functions of lever arm 108 and spring 107 are combined into a single spring means 113. When slide extension 92 is pulled outwardly end 114 of spring 113 snaps into slot 112 freeing the cam. When cam 103 has been repositioned as described above the further inward push of slide extension 92 causes end 114 to ride up into the notch 116 on the top of extension 92 causing the other end 117 of the spring to apply frictional locking pressure to the cam to hold it in the predetermined position. The upper and lower surfaces of cam 103 are usually roughened to assist in this holding function.

Figure 8:
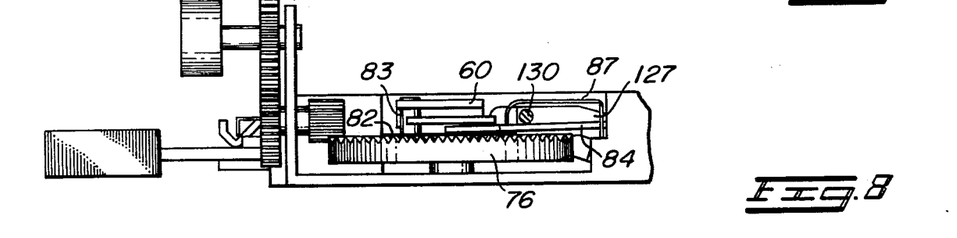
FIG. 8 is a side elevation view of a portion of FIG. 3 showing the manual tuning control means with clutch engaged.
Figure 9:
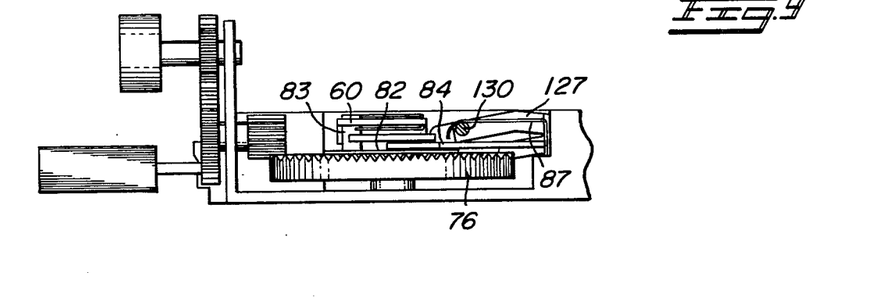
FIG. 9 is a view similar to FIG. 8 showing the clutch disengaged. p

When a station is recalled in the manner as described above means is provided for declutching the manual tuning control means so that the slide bar can be driven by the memory cam without the frictional drag of the manual tuning control means. The declutch means is shown in FIG. 2 and its operation is indicated in FIGS. 8 and 9. Declutch means 120 (FIG. 2) includes a declutch actuator 121 pivotably mounted to pin 104 on the underside of each slide 91 of the pushbutton assemblies. The manner in which the declutch actuator 121 is pivoted to disable the declutch means is discussed hereinafter. For the declutching operation, however, it is seen that the declutch actuator has a rearwardly extending finger 122 aligned with slot 22b of rear wall 19, and which finger is moved inwardly and outwardly with slide 91. A declutch bar 123 is mounted in the frame transverse the paths of movement of the pushbutton assemblies behind the rear wall 19 in aperture 124 of the side wall 17 and a similar aperture in side wall 15 (not shown) for pivotable movement about its longitudinal axis. Declutch bar 123 carries a plurality of declutch tabs 125 fixed to the bar and projecting therefrom in alignment with the finger of declutch actuator 122 of each pushbutton assembly. To the right end of declutch bar 123 (FIG. 2) is affixed cam 126. Cam follower means 127 is rotatably mounted in the frame by pins 128, 129 and carries eccentric arm 130 which is disposed under clutch hold down spring 87 (FIG. 8).

Figure 11:
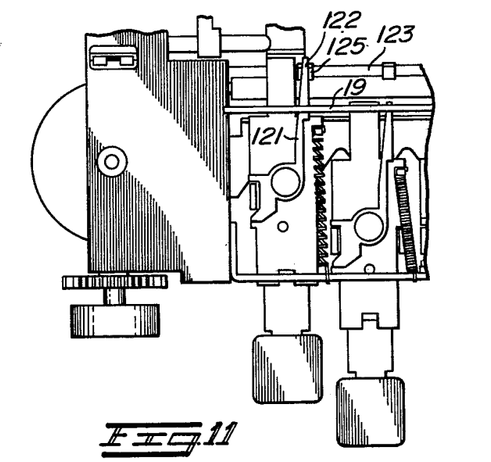
FIG. 11 is a view similar to FIG. 10 showing the left pushbutton depressed with the declutch actuator engaging the declutch bar resulting in the declutching action shown in FIG. 9.

The operation of the declutch means is as follows. When it is desired to recall a memorized frequency a pushbutton assembly is pushed inwardly. See left slide in FIG. 11. This action moves slide 91 and declutch actuator 121 inwardly to cause finger 122 to project through slot 22b in rear wall 19 to strike declutch tab 125 and rotate declutch bar 123 which raises cam 126 causing cam follower 127 to also raise (FIG. 9) forcing eccentric arm 130 against the hold down spring 87 lifting the same to relieve pressure from the clutch plate 82 and decouple the crown gear from clutch plate 82 and slide bar 60. Now further movement inwardly of the actuated pushbutton positions slide 60 to tune the radio. Release of the pushbutton causes spring 99 to return the slide to its original position. Bias means 131 concentrically mounted on the declutch bar shaft 123 to provide torsion returns the declutch bar to its original, nonrotated position. With cam 126 now removed, cam follower 127 under the action of clutch plate hold down spring 87 and gravity returns to its original position.

Figure 12:
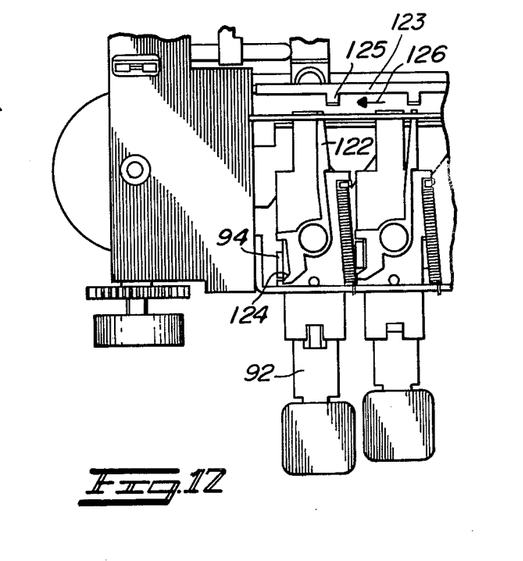
FIG. 12 is a view similar to FIG. 10 showing the left pushbutton in the outward extended position and the declutch actuator pivoted out of alignment with the declutch tab on the declutch bar disabling the declutch mechanism for setting a predetermined frequency into the memory cam.
Figure 13:
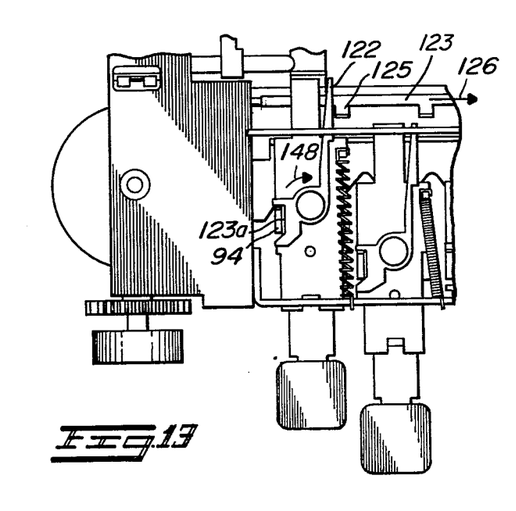
FIG. 13 is a view similar to FIG. 12 showing the left pushbutton depressed and the declutch actuator being reset, thereby momentarily moving the declutch bar to the right.

When setting up a new frequency onto a memory cam, i.e. when memorizing a frequency, means is provided for disabling the declutch mechanism. Here, the purpose is to leave the clutch engaged so that the frictional drag of the gears in the manual tuning control means will hold the slide bar in a firm position when pushing the pushbutton assembly inwardly and rotating the memory cam until it bottoms out in the V groove 61. In this manner the slide bar is not moved during the memorizing procedure and the radio is not detuned when setting up the new frequency. An efficient and effective memorizing procedure is thereby established. The declutch disabling means includes additional functions performed by the declutch actuator 121 and the declutch bar 123. The operation of the disabling means is shown in FIGS. 12 and 13. Declutch bar 123 is not only rotatable about its longitudinal axis as previously described but is also slideable sideways a short distance along its longitudinal axis without declutching. (See bar 123 in FIGS. 12 and 13). Torsion spring 131 also performs a dual function as serving as a compression spring to bias declutch bar 123 rightwardly as shown in FIG. 2. When the declutch bar moves sideways to the left (FIG. 2) against spring 131 it does not actuate the declutch mechanism since cam 126 can slide sideways under cam follower 127 without actuating the same (see FIG. 4). The declutch actuator 121 carries a second portion 122a having a notch 123a formed therein underlying the notch 95 in slide bar 91. The outboard edge of slot 123a is slanted to form a cammed surface 124. Depending flange 94 of the slide extension extends sufficiently downwardly to engage in notch 123a of declutch actuator 121.

As shown more particularly in FIG. 12, when the slide extension 91 is pulled outwardly depending flange 94 hits cam 124 and pivots declutch actuator 121 counterclockwise such that the finger portion 122 thereof is moved out of alignment with the depending tab 125 of the declutch bar while still being retained in slot 22b of rear wall 19. Cam 103 is now free to rotate as previously described. Slide extension 92 is now pushed inwardly carrying with it slide 91 and the memory cam with memory cam pin 105 engaging the sides of its assigned V groove 61 is rotated to align with the bottom of the groove as previously described. During this inward stroke finger 122 riding in slot 22b misses declutch tab 125. See the left pushbutton of FIGS. 12, 13.

Figure 10:
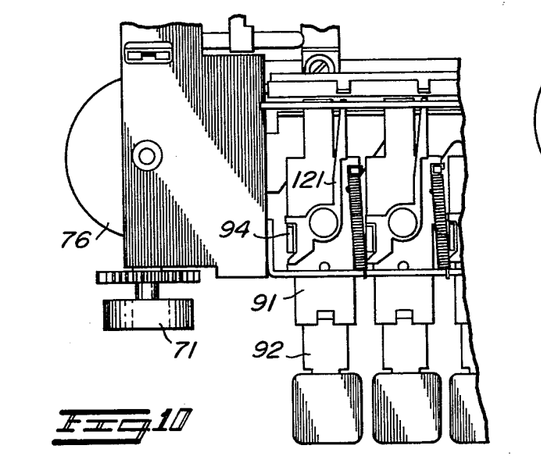
FIG. 10 is a bottom plan view of a portion of FIG. 3 showing the declutch actuating means with the pushbuttons in the normal unactuated position.

Thus the declutching mechanism has been disabled. With the pin 105 bottomed out in its assigned groove 61, slide 91 can no longer move inwardly. Further inward movement of slide extension 92 causes lever arm 108 to be pivoted to lock the cam in its position, as previously described and also flange 94 hits the tab at the end of notch 123a in declutch actuator 121 pivoting declutch actuator 121 clockwise as viewed in FIG. 13 see arrow on bar 123 causing finger 122 to strike the side of declutch tab 125 and move the declutch bar 123 sideways (see the arrow 126 on bar 123 FIG. 13) against the compression of spring 131 without declutching the clutch mechanism. The declutch actuator 121 has now been reset in its original position momentarily displacing the declutch bar 123 sideways in the process. Release of slide extension 92 causes the slide 91 and the extension 92 to be returned outwardly to their original position by bias spring 99 and declutch bar 123 is returned to its original position under the action of compression spring 131. See FIG. 10. Now finger 122 is aligned with declutch tab 125 and whenever the station is recalled by pushing in the pushbutton, finger 122 strikes tab 125 to declutch the manual tuning control as previously described.

Shown in FIG. 1 is a pointer assembly 130 for positioning a dial pointer (not shown) for displaying, in combination with a dial carrying frequency indicia thereon, the frequency to which the radio is tuned by either the manual tuning control means 70 or the pushbutton assemblies 90. The drive means for operating the dial pointer assembly is shown in FIG. 2. A lever arm 131 is pivotably mounted to the underside of top wall 12 of the frame by screw 132. One end of lever 131 has a slot 133 engaging a pin 134 mounted on slide bar 60. The other end of lever 131 carries a pin 135 (see FIG. 1 also) which engages in a slot in an arm 136 pivotably mounted to the top of wall 12 of the frame. It is apparent that movement of the slide bar 60 sideways moves pin 134 which rotates lever arm 131 causing pin 135 to drive arm 136 of the pointer mechanism. The pointer mechanism is a parallelogram linkage which operates in the manner previously disclosed in Olah U.S. Pat. No. 3,756,191 assigned to the same assignee as is the present invention and the disclosure of which is incorporated by reference herein. The pointer mechanism, briefly, is pivotably mounted to the top wall 12 only at pins 137, 138. Arm 136 is pivotably connected to arm 139 at joint 140. Arm 139 is connected to the parallelogram linkage at joint 141. The parallelogram linkage includes parallel arms 142, 143 and parallel arms 144, 145. Arm 145 is connected to a slide 146 which rides in a slot 147 in tuner top wall 12. Arm 136 is preferably metal and arms 139, 142, 143, 144 and 145 are preferably made out of plastic. Flexible joints connect arms 142 and 145, arms 143 and 145 and arms 143 and 144. It is now apparent that movement of pin 135 in arm 136 in response to sideways actuation of slide bar 60 results in movement of the linkage assembly and positioning of slide 146 in slot 147 to a point corresponding to the selected frequency.

What has been described is a flat tuner in which all of the major moving parts are disposed horizontally and the overall thickness of the tuner may be reduced to an extremely small size not previously achievable in a mechanical tuner. The approximate height of applicant's tuner is 0.62 inches, including the pointer assembly which is also very thin in the order of 1/16 inch. The disclosed design results in a stroke of about 0.438 inches of the slugs within the coils to tune the radio from the lowest to the highest frequency in the conventional broadcast band. It is apparent that in place of slug tuning, lever arm 37 may be used to drive a potentiometer or other tuning means which may be connected in an electrical circuit for electronic tuning of all or a portion of the radio.

I claim:

1. A pushbutton tuner comprising
   a tuner frame having a thickness dimension measured in a first plane and a width dimension measured in a second plane perpendicular to the first plane,
   tuning means mounted to the frame movable to a plurality of positions representative of desired broadcast frequencies, and
   a plurality of pushbutton assemblies mounted in the frame for in and out movement and each one of which carries a presettable memory cam means for recalling a memorized broadcast frequency when the one pushbutton assembly is pushed inwardly, upon actuation of a pushbutton assembly the tuning means being driven to the position corresponding to the memorized frequency of the cam carried by the actuated pushbutton
   wherein the improvement comprises
   slide bar means having a relatively thin dimension measured in a plane parallel to the first plane and mounted in the frame in a plane parallel to the second plane and slidable transverse the path of movement of the pushbutton assemblies for positioning the tuning means in response to driving actuation by any one of the memory cams,
   a plurality of open shaped notches having cam surfaces in the slide bar aligned with the pushbutton assemblies,
   the memory cam being received within its aligned open notch and engaging a cam surface thereof only when the selected pushbutton assembly carrying said memory cam is pushed in and otherwise being completely removed from its aligned open notch
   inward movement of a memory cam within its aligned notch driving the slide bar transversely until the memory cam reaches the end of its travel on the engaged cam surface of its aligned notch, the slide bar and tuning means being thereby moved to the position corresponding to the memorized frequency of the actuated cam.

2. A pushbutton tuner comprising
   a tuner frame having a thickness dimension measured in a first plane and a width dimension measured in a second plane perpendicular to the first plane,
   tuning means mounted to the frame movable to a plurality of positions representative of desired broadcast frequencies, and
   a plurality of pushbutton assemblies mounted in the frame for in and out movement and each one of which carries a presettable memory cam means for recalling a memorized broadcast frequency when the one pushbutton assembly is pushed inwardly, upon actuation of a pushbutton assembly the tuning means being driven to the position corresponding to the memorized frequency of the cam carried by the actuated pushbutton
   wherein the improvement comprises
   slide bar means having a relatively thin dimension measured in a plane parallel to the first plane and mounted in the frame in a plane parallel to the second plane and slidable transverse the path of movement of the pushbutton assemblies for positioning the tuning means in response to driving actuation by any one of the memory cams,
   a plurality of shaped notches in the slide bar aligned with the pushbutton assemblies and adapted for receiving the memory cams,
   inward movement of a memory cam within its aligned notch driving the slide bar sideways until the cam is bottomed out in the notch, the slide bar and tuning means being thereby moved to the position corresponding to the memorized frequency of the actuated cam,
   manual tuning control means including clutch means,
   a crown gear having a relatively thin dimension measured in a plane parallel to the first plane and rotatably mounted in the frame about an axis perpendicular to the second plane for driving the slide bar means in response to operation of the manual tuning control means, and
   means for declutching the manual tuning control means when driving the slide bar with one of the pushbutton assemblies to recall a memorized frequency.

3. The pushbutton tuner as claimed in claim 2 wherein the tuner frame, tuning means, pushbutton assemblies, slide bar means, manual tuning control means and crown gear have a relatively thin profile when assembled in the range of 0.62 inches.

4. The pushbutton tuner as claimed in claim 3 wherein the tuning means includes a coil housing having a plurality of coils, a carriage and a plurality of cores carried by the carriage and positionable within the coils of the coil housing for tuning to a selected broadcast frequency further comprising
   the coil housing located to the rear of the tuner frame with the cores movable in planes parallel to the paths of movement of the pushbuttons, and
   means connecting the slide bar means and the carriage for converting sideways movement of the slide bar to in and out movement of the cores.

5. The pushbutton tuner as claimed in claim 3 wherein the tuning means includes a coil housing having a plurality of coils, a carriage and a plurality of cores carried by the carriage and positionable within the coils of the coil housing for tuning to a selected broadcast frequency further comprising
   the coil housing located toward one side of the tuner frame with the cores movable in planes transverse to the paths of movement of the pushbuttons, and
   means connecting the slide bar means and the carriage for converting sideways movement of the slide bar to in and out movement of the cores.

6. The pushbutton tuner as claimed in claim 2 wherein the declutching means comprises
   a declutch actuator mounted on each pushbutton assembly for in and out movement with the assembly,
   a declutch bar rotatably mounted in the frame transverse the paths of movement of the pushbutton assemblies,
   a plurality of declutch tabs fixed to the declutch bar and projecting therefrom in alignment with the declutch actuators,
   the clutch means mounted between the crown gear and the slide bar and providing a releasable frictional coupling therebetween, first bias means biasing the clutch means into engagement, cam and follower means mounted between the declutch bar and the first biasing means for removing the pressure of the first biasing means in response to rotation of the declutch bar, and second biasing means for biasing the declutch bar to the nonrotated position and for biasing the pushbutton assemblies to the out position whereby when a pushbutton assembly is pushed in to recall a memorized frequency, the declutch actuator strikes the aligned declutch tab to rotate the declutch bar and declutch the manual tuning means.

7. The pushbutton tuner as claimed in claim 6 further comprising means for disabling the declutch mechanism when memorizing a frequency with the memory cam means including the declutch bar slideable sideways between a first position with the clutch means engaged and a second position without declutching, means for biasing the declutch bar to the first position, each of the declutch actuators pivotable between a first position aligned with a declutch tab and a second position clear of the declutch tab, and means for moving each of the declutch actuators from the first to the second position while setting the memory cam to memorize a predetermined frequency with the declutch bar in the first position and for resetting the declutch actuators from the second to the first position after the frequency has been memorized while momentarily displacing the declutch bar to the second position.

8. The pushbutton tuner as claimed in claim 2 wherein each pushbutton assembly comprises a slide mounted in the frame for guided in and out movement, a slide extension mounted on the slide for movement therewith and also for limited movement relative thereto between an outward position and an inward position, a memory cam mounted on the slide for in and out movement therewith and pivotable about a vertical axis, means for unlocking the cam when the slide extension is moved to its outward position, for permitting the pushbutton assembly to be moved inwardly as a unit until the cam bottoms out in its aligned notch pivoting the cam to a position corresponding to a predetermined frequency and for locking the cam in said position when the slide extension is moved to its inward position, and means for biasing the pushbutton assembly outwardly whereby the selected frequency can be recalled at any time by again pushing in on the pushbutton assembly.

9. The pushbutton tuner as claimed in claim 8 wherein the unlocking and locking means comprises a lever resiliently fulcrumed on the slide having one end extending outwardly to cooperate with the slide extension and the other end movable between engaged and released positions relative to the memory cam, the lever being biased to the released position, means on the slide extension for moving the outward end of the lever to unlock the cam when the slide extension is in the outward position, to wedgingly hold the slide extension and slide together when the pushbutton assembly is pushed inwardly to position the memory cam and to lock the cam when the slide extension is in the inward position.

10. A pushbutton tuner having a tuner frame, tuning means mounted to the frame movable to a plurality of positions representative of desired broadcast frequencies, a plurality of pushbutton assemblies mounted in the frame for in and out movement and each one of which carries a presettable memory cam means for recalling a memorized broadcast frequency when the one pushbutton assembly is pushed inwardly, means for driving the tuning means in response to actuation by any one of the pushbutton assemblies to the position corresponding to the memorized frequency of the cam carried by the actuated assembly, manual tuning control means, clutch means for releasably coupling operation of the manual tuning control means to the drive means, means for declutching the manual tuning control means when recalling a memorized frequency by operating the drive means from the pushbutton assemblies, and means for disabling the declutch means when setting a predetermined frequency into the memory cam means wherein the improvement comprises the declutching and disabling means having a declutch bar rotatably mounted in the frame for movement about an axis transverse the paths of movement of the pushbutton assemblies for declutching and also slideably mounted for movement along said axis between a first position with the clutch engaged and a second position without declutching, means biasing the declutch bar into the first position, a declutch actuator carried by the pushbutton assembly and pivotable between a first position aligned to engage the declutch bar and declutch the manual tuning control when recalling a memorized frequency and a second position clear of the declutch bar to disable the declutch means when setting a predetermined frequency into the memory cam means while momentarily displacing the declutch bar along its axis to the second position against the action of the biasing means.

11. A pushbutton tuner having a tuner frame having a thickness dimension measured in a first plane and a width dimension measured in a second plane perpendicular to the first plane, tuning means mounted to the frame movable to a plurality of positions representative of desired broadcast frequencies, a plurality of pushbutton assemblies mounted in the frame for in and out movement and each one of which carries a presettable memory cam means for recalling a memorized broadcast frequency when the one pushbutton assembly is pushed inwardly, means for driving the tuning means in response to actuation by any one of the pushbutton assemblies to the position corresponding to the memorized frequency of the cam carried by the actuated assembly,
manual tuning control means,
clutch means for releasably coupling operation of the manual tuning control means to the drive means,
means for declutching the manual tuning control means when recalling a memorized frequency by operating the drive means from the pushbutton assemblies, and
means for disabling the declutch means when setting a predetermined frequency into the memory cam means
wherein the improvement comprises
the drive means including a slide bar mounted in the frame in a plane parallel to the second plane and slidable transverse the path of movement of the pushbutton assemblies for positioning the tuning means,
the manual tuning control means includes a crown gear rotatably mounted about an axis perpendicular to the second plane for driving the slide bar,
the pushbutton assemblies include slides carrying the presettable memory cam means and the declutch disabling means, and
the overall dimension of the tuner measured in the first plane presents a relatively thin profile when assembled in the range of 0.62 inches.

12. A treadlebarless pushbutton tuner comprising
a tuner frame having a thickness dimension measured in a first plane and a width dimension measured in a second plane perpendicular to the first plane
tuning means mounted to the frame movable to a plurality of positions representative of desired broadcast frequencies,
a plurality of pushbutton assemblies mounted in the frame for in and out movement and each one of which carries a presettable memory cam means for recalling a memorized broadcast frequency when the one pushbutton assembly is pushed inwardly, upon actuation of a pushbutton assembly the tuning means being driven to the position corresponding to the memorized frequency of the cam carried by the actuated pushbutton,
manual tuning control means including clutch means, and
declutching means,
wherein the improvement comprises
slide bar means mounted in the frame for movement transverse the path of movement of the pushbutton assemblies for positioning the tuning means in response to driving actuation by any one of the memory cams,
a crown gear having a relatively thin dimension measured in a plane parallel to the first plane and rotatably mounted in the frame about an axis perpendicular to the second plane for driving the slide bar means in response to operation of the manual tuning control means, and
the declutching means declutches the manual tuning control means when driving the slide bar with one of the pushbutton assemblies to recall a memorized frequency.

* * * * *